(12) United States Patent
Lee et al.

(10) Patent No.: US 6,404,631 B1
(45) Date of Patent: Jun. 11, 2002

(54) COOLING DEVICE OF LINEAR POWER AMPLIFIER IN MOBILE COMMUNICATION SYSTEM

(75) Inventors: Dong Gyu Lee; Jae Sea Koo, both of Ichon (KR)

(73) Assignee: Hyundai Electronics Industries, Co., Ltd.

( * ) Notice: Subject to any disclaimer, the term of this patent is extended or adjusted under 35 U.S.C. 154(b) by 0 days.

(21) Appl. No.: 09/722,777

(22) Filed: Nov. 27, 2000

(30) Foreign Application Priority Data

Nov. 8, 2000 (KR) ............................................. 00-66151
Nov. 8, 2000 (KR) ............................................. 00-66152

(51) Int. Cl.[7] ................................................ H05K 7/20
(52) U.S. Cl. ................... 361/699; 165/104.33; 330/289
(58) Field of Search .............................. 165/80.3, 80.4, 165/104.27, 104.28, 104.33; 62/259.2; 257/714; 174/15.1; 361/689, 690, 695, 698, 699; 455/344, 347, 348; 330/65–67, 289, 295

(56) References Cited

U.S. PATENT DOCUMENTS 3,776,305 A * 12/1973 Simmons ............... 165/104.25
4,204,246 A * 5/1980 Arii et al. .................... 361/699
5,703,536 A * 12/1997 Davis et al. ................. 330/289
5,815,370 A * 9/1998 Sutton
6,102,110 A * 8/2000 Julien et al.
6,233,146 B1 * 5/2001 Gilchrist et al.

* cited by examiner

Primary Examiner—Gerald Tolin
(74) Attorney, Agent, or Firm—Baker Botts LLP

(57) ABSTRACT

Disclosed is a cooling device of a linear power amplifier in a mobile communication system capable of continuously and repeatedly circulating a cooling water heat-exchanged at a low temperature in a base on which the linear power amplifier is mounted, thus to enable the heat transmitted to the whole liner power amplifier from a radio frequency transistor to be cooled by using the cooling water having a substantially higher coefficient of heat transfer than that of air. The cooling device includes a cooling water generating portion for generating a cooling water of a low temperature within an outer body of a base station transceiver subsystem, and a cooling portion for flowing the cooling water of the low temperature generated in the cooling water generating portion to the interior of a base on which the linear power amplifier is mounted, absorbing a surrounding heat to the cooling water of the low temperature, and then discharging the resulting water to the cooling water generating portion.

4 Claims, 8 Drawing Sheets

COOLING DEVICE OF LINEAR POWER AMPLIFIER IN MOBILE COMMUNICATION SYSTEM

BACKGROUND OF THE INVENTION

1. Field of the Invention

The present invention relates to a base station transceiver subsystem of a mobile communication system and more particularly, to a cooling device of a linear power amplifier in a mobile communication system capable of preventing the malfunctions of the linear power amplifier caused due to overheating of a radio frequency transistor as a principal part of the linear power amplifier used in a base station transceiver subsystem.

2. Description of the Related Art

In a general mobile communication system such as, for example, a digital cellular system (DCS), a personal communication system (PCS), an IMT-2000 system and the like, a mobile station (MS) inputs and outputs the signal on the end thereof, a base station transceiver subsystem (BTS) carries out a radio communication with the mobile station, and a base station controller (BSC) controls the base station transceiver subsystem. A mobile switching center (MSC) carries out a switching for the signal transmitted from the mobile station to another communication network and a switching for the signal transmitted from another communication network to thereby connect to the mobile station.

Under the above mobile communication system, a linear power amplifier, which is secured in isolation on the one side of the interior of the base station transceiver subsystem, is a very important element serving to amplify the radio frequency signal transmitted or received.

In case of transmitting a signal from the base station transceiver subsystem to the outside, if the output of the signal is to be high, there is a need for a power amplifier having a high output. Hence, a radio frequency transistor linearly amplifying the output signal in proportion to the input signal exhibits a high heating value. In this way, the thus-generated heat should be emitted to the outside, but such the emission of the heat has been emerged as one of important factors from the viewpoint of the performance and safety of the mobile communication system.

In order to emit the heat generated in the interior of the base station transceiver subsystem, there is a conventionally proposed air-cooling type cooling device using a cooling fan. However, the conventional air-cooling type cooling device exhibits limitations in controlling a high heating temperature of the radio frequency transistor having a high output and hence, there still occurs a problem that the distortion of a circuit is caused due to the high heating temperature. Additionally, the air-cooling type cooling device should be provided with a passage communicating to the outside in order to let flesh air therein, which results in the generation of a waterproof problem and the weakness to powdered dusts.

Further, the vibration caused during the driving of the cooling fan is transmitted to peripheral devices, which results in the shortening of the life of product. Due to the noises generated by the vibration, the surrounding environment is affected, which results in the reduction of the reliability of a user for the product.

SUMMARY OF THE INVENTION

It is, therefore, an object of the present invention to provide a cooling device of a linear power amplifier in a mobile communication system capable of enabling the heat transmitted to the whole liner power amplifier from a radio frequency transistor to be cooled by using a liquid having a substantially higher coefficient of heat transfer than that of air, thereby preventing a temperature of the linear power amplifier from being risen.

To attain this and other objects of the present invention, there is provided a cooling device of a linear power amplifier in a mobile communication system, which comprises: a cooling water generating portion for generating a cooling water having a low temperature within an outer body of a base station transceiver subsystem; and a cooling portion to which the cooling water having the low temperature generated in the cooling water generation portion flow to thereby absorb a surrounding heat and then discharge the resulting water to the cooling water generating portion.

DETAILED DESCRIPTION OF THE PREFERRED EMBODIMENTS

Now, an explanation of the construction of a cooling device of a linear power amplifier in a mobile communication system according to the present invention will be hereinafter discussed with reference to FIGS. 1 and 2.

Figure 1:
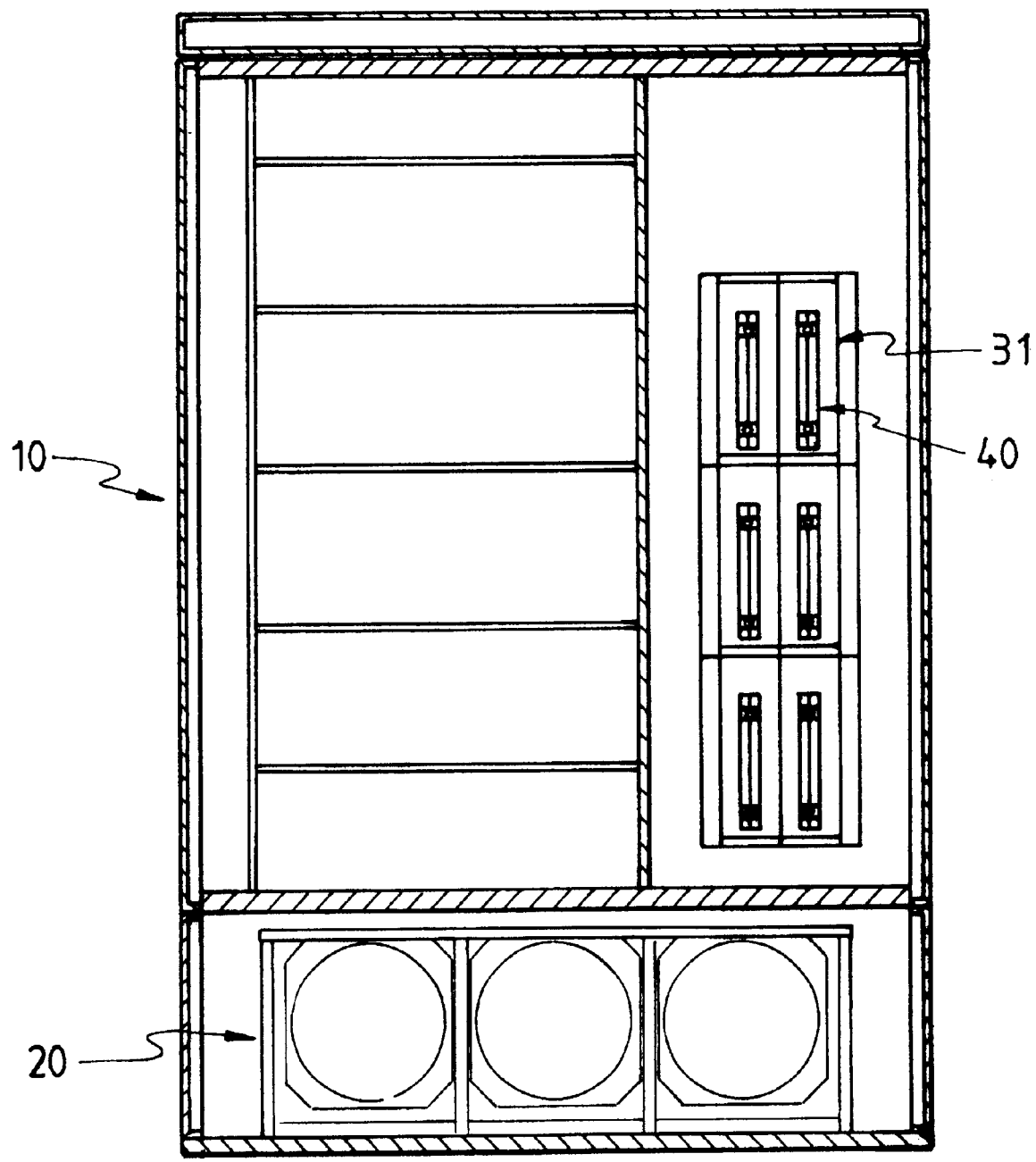
FIG. 1 is a schematic sectional view illustrating a base station transceiver subsystem to which the cooling device of the present invention is adopted.
Figure 2:
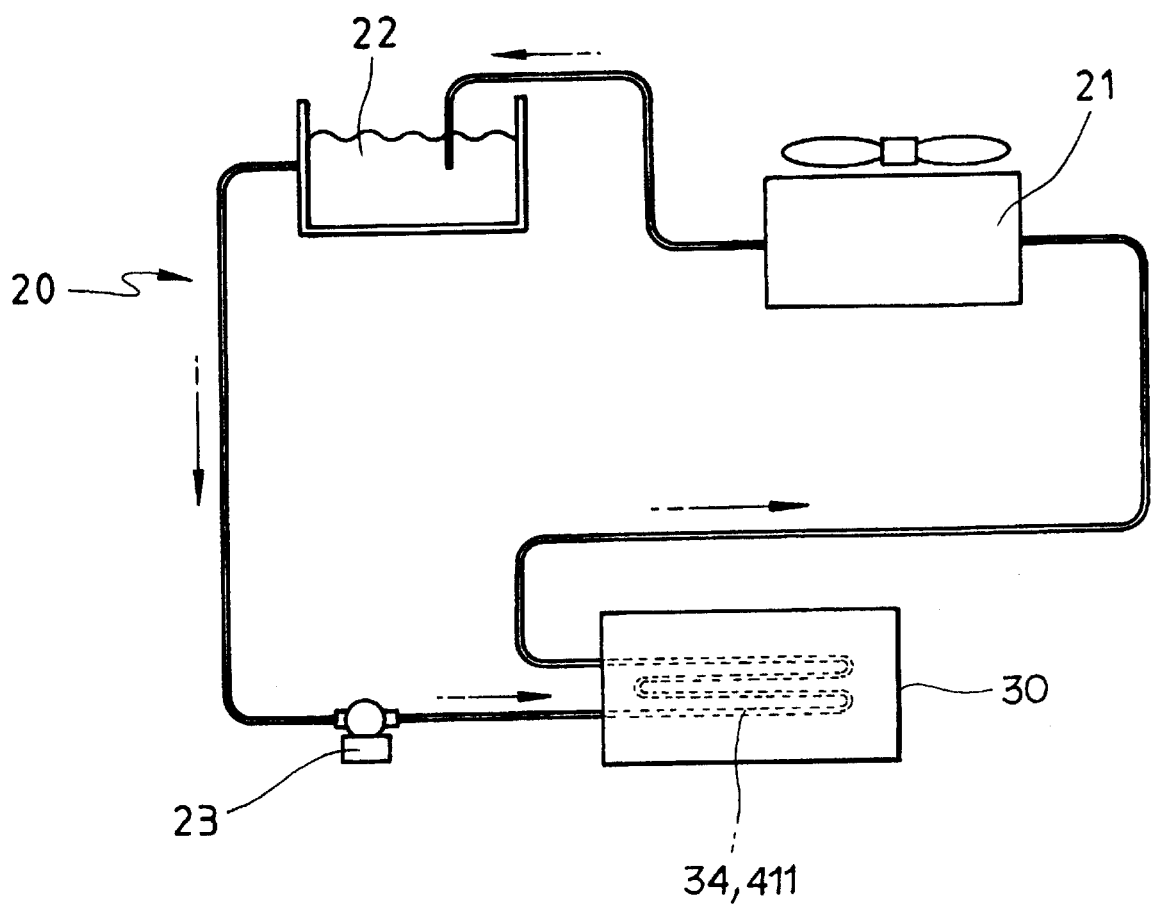
FIG. 2 is an exemplary view illustrating a cooling cycle to which the cooling device of the present invention is adopted.

FIG. 1 is a schematic sectional view illustrating a base station transceiver subsystem to which the cooling device of the present invention is adopted, and FIG. 2 is an exemplary view illustrating a cooling cycle to which the cooling device of the present invention is adopted.

A cooling water generating portion 20, which has a typically cooling function, while forcibly circulating water by using a pumping force, is composed of a radiator 21 that carries out heat exchange for the cooling water having a temperature raised by the absorption of the heat generated from the linear power amplifier, at a normal temperature by virtue of a blowing force of a fan, a water tub 22 where the water heat-exchanged through the radiator 21 is retained, and a pump 23 for forcibly absorbing the water retained in the water tub 22 to thereby pump the absorbed water to a cooling portion 30.

The cooling water generating portion 20 is embodied with a generally known cooling circuit and it is desirably installed on the lower portion of an outer body 10.

Figure 3:
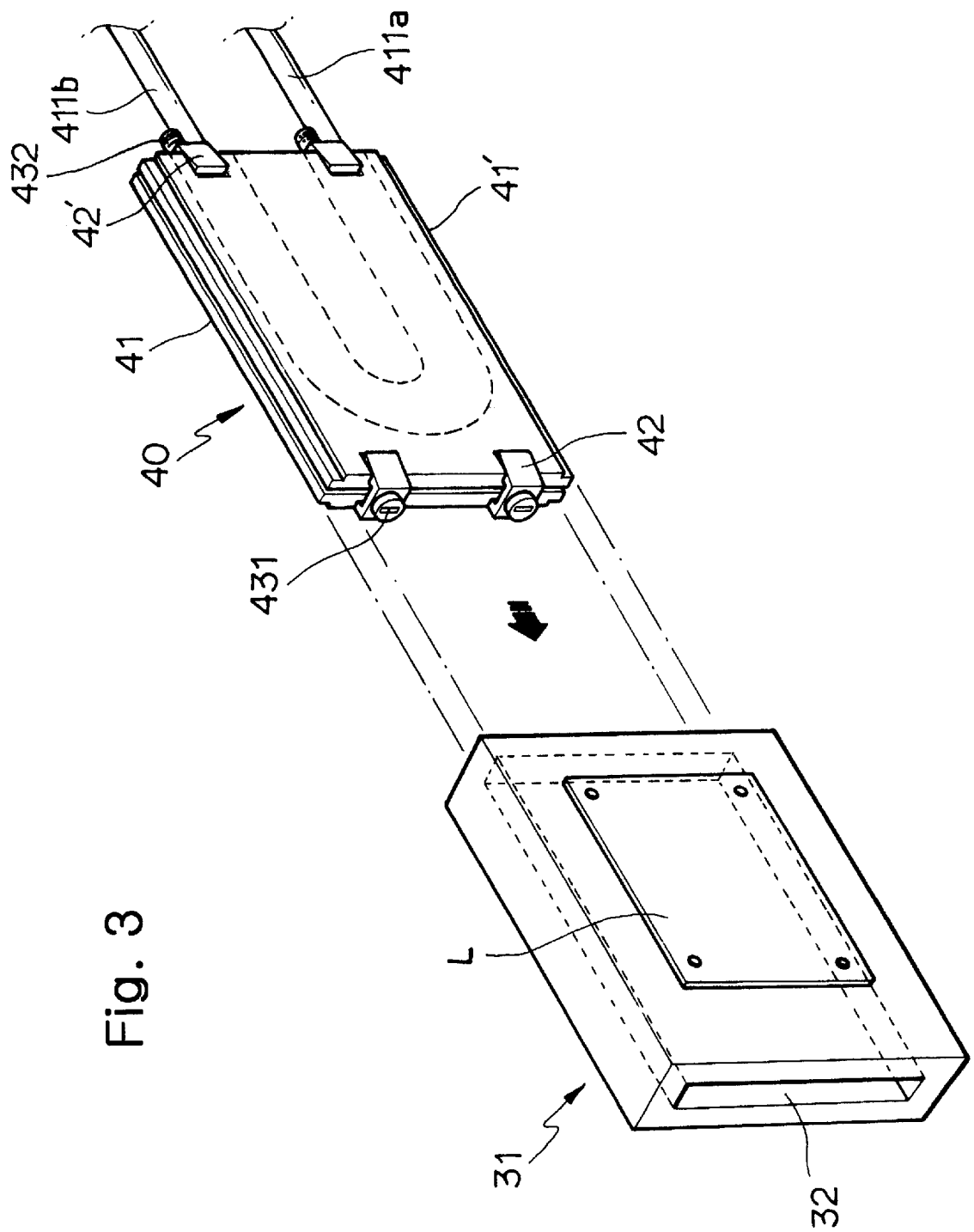
FIG. 3 is a separated perspective view illustrating the base and the cooling unit in the cooling device of the present invention.
Figure 4:
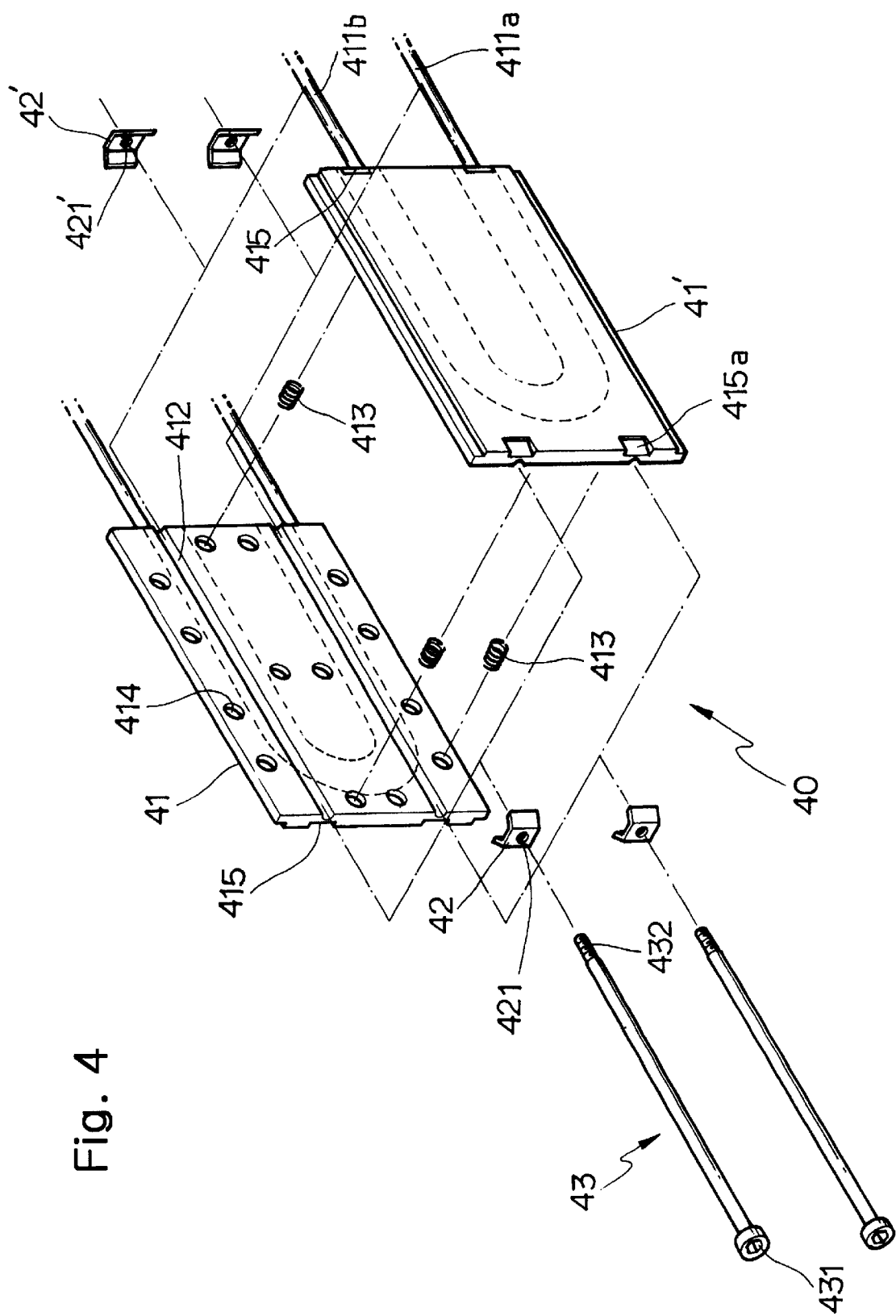
FIG. 4 is a separated perspective view illustrating the cooling unit in the cooling device of the present invention.
Figure 5:
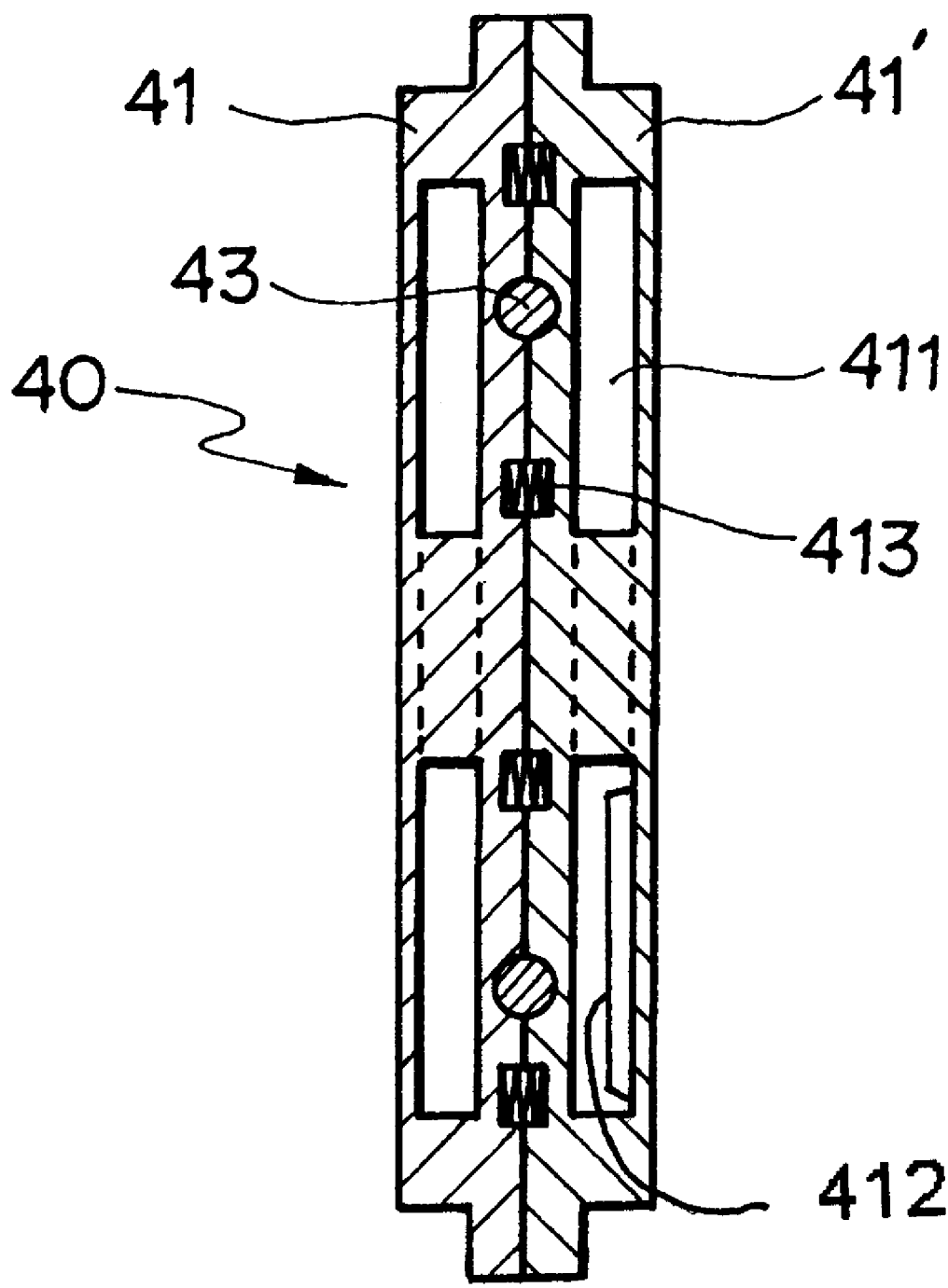
FIG. 5 is a sectional view illustrating the cooling unit in the cooling device of the present invention.

FIG. 3 is a separated perspective view of the base and the cooling unit in the cooling device of the present invention, FIG. 4 is a separated perspective view of the cooling unit in the cooling device of the present invention, and FIG. 5 is a sectional view of the cooling unit in the cooling device of the present invention.

The cooling portion 30 is composed of a receiving space 32 having a predetermined area that is opened at both sides thereof in the interior of a base 31 and a cooling unit 40 that is inserted and drawn into/from the receiving space 32, for absorbing a surrounding heat to the cooling water of a low temperature generated in the cooling water generating portion 20 and then discharging the resulting water to the cooling water generating portion 20.

In more detail, the receiving space 32 has horizontal upper and bottom surfaces and vertical both sides in the interior of the base 31 of a right-angled hexahedron having a predetermined thickness and is opened forward and backward.

The cooling unit 40, which is adapted to be inserted and drawn into/from the receiving space 32, includes a pair of first and second cooling plates 41 and 41' each having a "U"-shaped cooling water moving passage 411 with an inlet 411a and an outlet 411b on the one side thereof in the interior thereof, a semicircular guide groove 412 formed in a longitudinal direction on the up and down horizontal positions of the inner sides thereof, a plurality of spring support grooves 414 into which springs 413 having the same number as the spring support grooves 414 are mounted at predetermined intervals on the inner sides relative to the guide groove 412, and upper and lower locking protrusions 415 cut to form upper and lower inclined surfaces 415a inclined by a predetermined angle from the outside to the inside on the edges of the outer sides corresponding to the center of the guide groove 412.

There are provided two sets of clips 42 and 42' extending to the both sides thereof at the same angle as in the inclined surfaces 415a of the upper and lower locking protrusions 415, each of which has a guide hole 421 on the center of the front surface thereof. The two sets of clips 42 and 42' are inserted into the upper and lower locking protrusions 415 formed on the front and rear ends of the pair of first and second cooling plates 41 and 41' in the state where the inner sides of the pair of first and second cooling plates 41 and 41' correspond to each other. The clips 42 as inserted on the front ends of the cooling plates 41 and 41' form the guide hole 421 as a hole and the clips 42' as inserted on the rear ends of the first and second cooling plates 41 and 41' form the guide hole 421 as a nut hole.

There are provided upper and lower wrench bolts 43 which form a wrench groove 431 on the front ends thereof and a helix 432 on the back ends thereof, such that they pass through the respective guide groove 412 on the inner sides of the cooling plates 41 and 41' via the front clips 42 and are screw-coupled to the rear clips 42'.

The cooling unit 40 configured with the above-mentioned parts is assembled in the following order.

First, the one side of each of the springs 413 is inserted into each of the spring support grooves 414 formed on the inner surface of the first cooling plate 41 and then, in the state where the inner surface of the first cooling plate 41 is opposite to the inner surface of the second cooling plate 41', the other side of each of the springs 413 is fully inserted into each of the spring support grooves 414 formed on the inner surface of the second cooling plate 41'.

Then, the clip 42 on which the guide hole 421 as the hole is formed is fitted to each of the upper and lower locking protrusions 415 formed on the front portions of the first and second cooling plates 41 and 41' assembled to be opposite to each other, and the clip 42' on which the guide hole 421 as the nut hole is formed is fitted to each of the upper and lower locking protrusions 415 formed on the rear portion thereof. In this state, each of the wrench bolts 43 is passed through the guide hole 421 of the front clip 42 and then screw-coupled to the guide hole 421' of the rear clip 42'.

Next, an explanation of the installation procedure of inserting thus-assembled cooling unit 40 into the receiving space 32 formed on the base 31 will be discussed.

First, if each of the wrench bolts 43 turns in a bolt-tightening direction, the helix 432 formed on the end of the wrench bolt 43 is coupled to the guide hole 421' of the rear clip 42' and at the same time, the front and rear clips 42 and 42' being opposite to each other move inwardly along the inclined surfaces 415a of the locking protrusions 415 provided on the front and rear portions of the first and second cooling plates 41 and 41', thereby allowing the interval between the first and second cooling plates 41 and 41' assembled to be opposite to each other to be reduced. In this process, the springs 413 interposed between the first and second cooling plates 41 and 41' are compressed and the whole thickness of the cooling unit 40 is thus reduced thinner than that upon an initial coupling.

Figure 6:
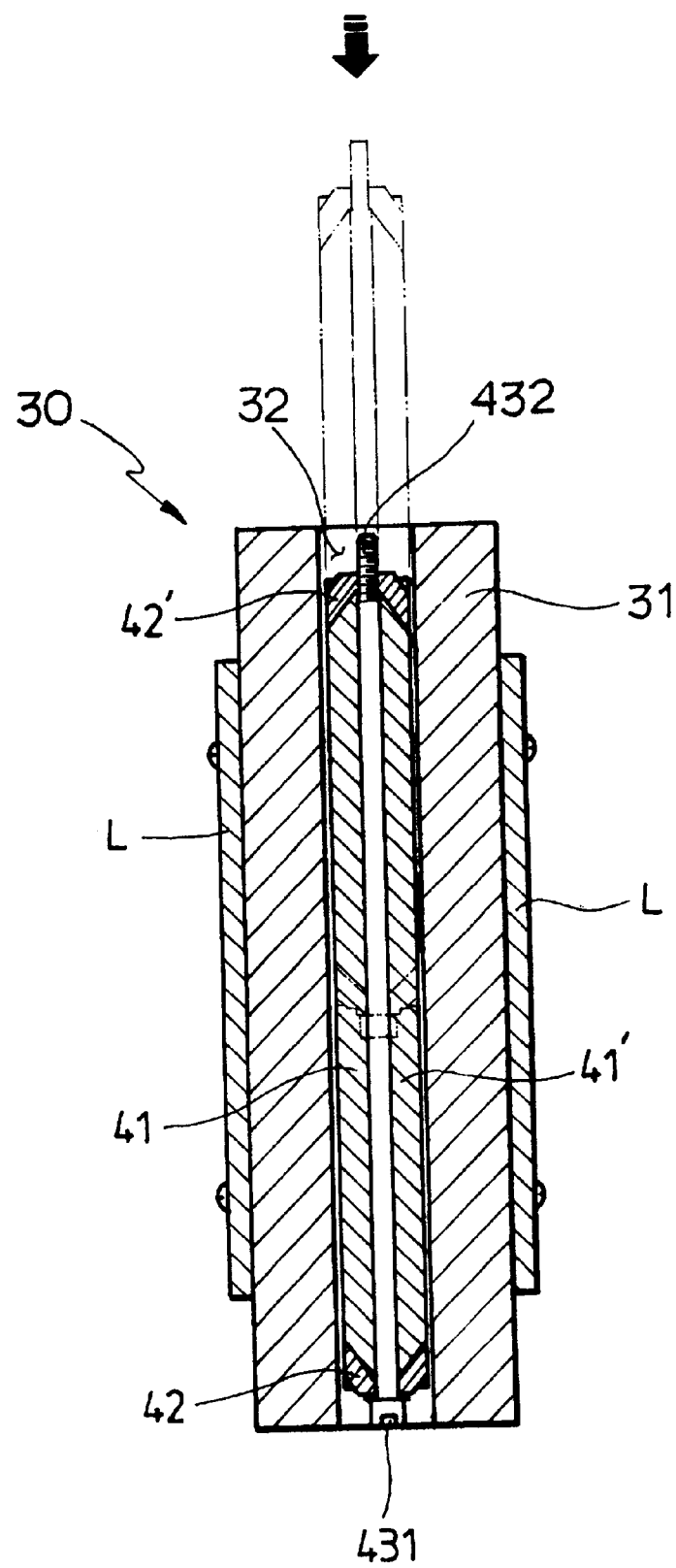
FIG. 6 is a sectional view illustrating the state where the cooling unit is inserted into the receiving space.

Next, the cooling unit 40 whose thickness is reduced is pushed at the one side of the receiving space 32 formed in the interior of the base 31 towards the other side thereof, such that the cooling unit 40 is completely inserted into the receiving space 32, as shown in FIG. 6.

Figure 7:
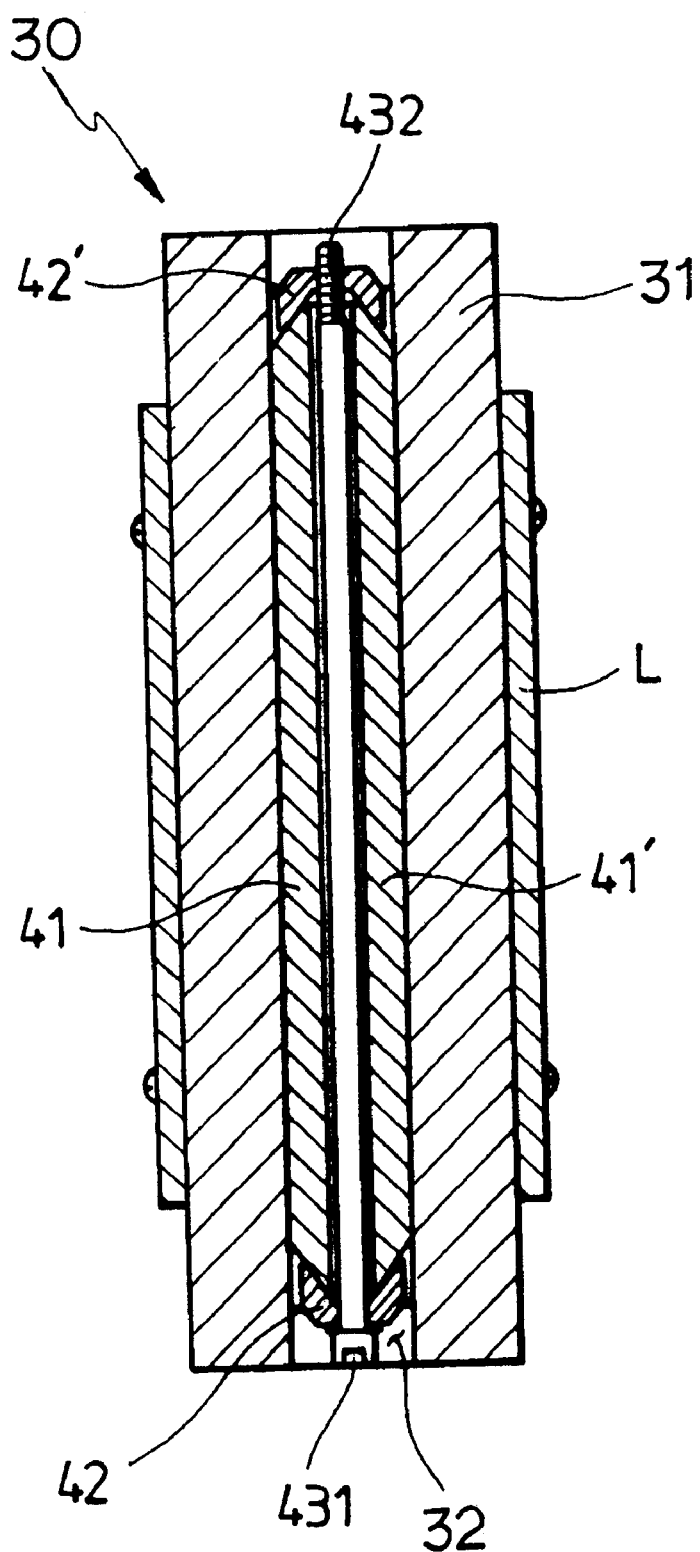
FIG. 7 is a sectional view illustrating the state where the cooling unit is completely inserted into the receiving space.

If the insertion of the cooling unit 40 into the receiving space 32 of the base 31 is completed, the wrench bolts 43 turn in a bolt-loosing direction. At this time, each wrench bolt 43 is loosed from the guide hole 421' of the rear clip 42' towards the front portion thereof. Thereby, each of the front and rear clips 42 and 42' moves outwardly along the inclined surface 415a of each of the locking protrusion 415 and at the same time, each of the springs 413 which has been interposed in a compressed state between the first and second cooling plates 41 and 41' is restored, thereby allowing the first and second cooling plates 41 and 41' to extend outwardly. As a result, if the surfaces of the first and second cooling plates 41 and 41' come in full contact with the both surfaces of the receiving space 32, the rotation of the wrench bolts 43 is stopped, thereby completing the installation of the cooling unit 40, as shown in FIG. 7.

The base 31 with the cooling portion 30 is provided with a linear power amplifier L and thus installed in the one side of the interior of the base station transceiver subsystem 10. The inlet 411a side of the "U"-shaped cooling water moving passage 411 formed on the interior of the cooling unit 40 is connected to the outlet side of the pump 23 on which the cooling water of a low temperature flows from the cooling water generating portion 20 and is pumped to the other side of the pump 23, and the outlet 411b thereof is connected to the inlet side of the radiator 21.

Figure 8:
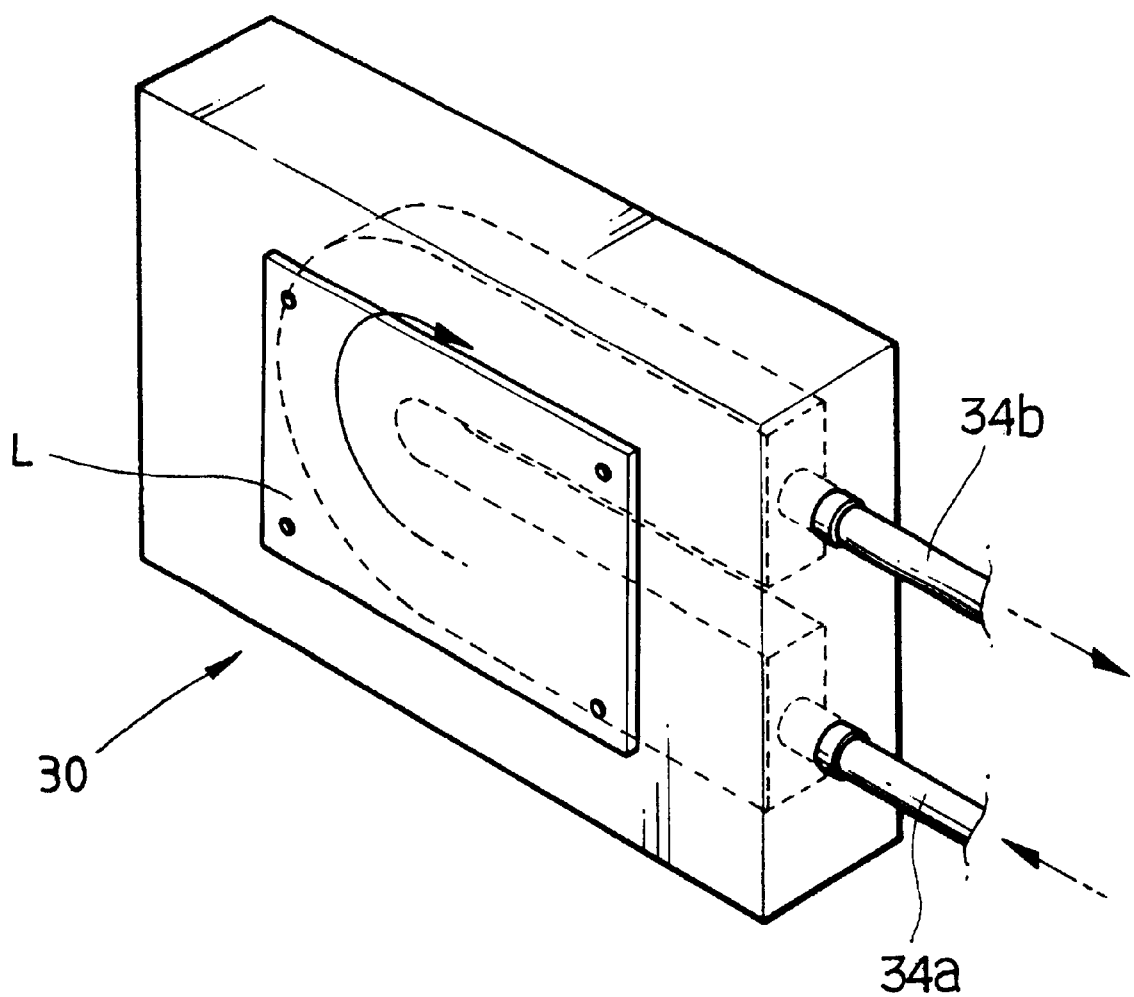
FIG. 8 is a perspective view illustrating another example of the cooling portion in the cooling device of the present invention.

According to another embodiment of the present invention, a cooling water moving passage 34 is directly constructed in the interior of the base 31, as shown in FIG. 8, such that the cooling water of a low temperature flows from the cooling water generating portion 20 and after absorbing surrounding heat, is discharged.

In the preferred embodiment of the present invention, also, a plurality of cooling fins 412 are installed at predetermined intervals in the interior of the cooling water moving passages 411, 34, for the purpose of extending a heat transmission area.

Next, an explanation of the cooling procedure of the linear power amplifier in accordance with the principles of the present invention will be discussed.

The cooling water retained in the water tub 22 of the cooling water generating portion 20 is forcedly pumped to the cooling unit 40 side by means of the pump 23.

The pumped cooling water flows to the inlet 411a of the cooling water moving passage 411 in each of the first and second cooling plates 41 and 41' constituting the cooling unit 40 and then absorbs the heat transmitted from the radio frequency transistor to the base 31 and the cooling unit 40, thereby making the linear power amplifier cooled.

Through the above procedure, the cooling water to which the heat is absorbed is discharged to the radiator 21 through the outlet 411b of the cooling water moving passage 411.

The cooling water, which has a high temperature due to the absorption of the heat generated in the radio frequency transistor, is passed through the radiator 21, such that it is heat-exchanged at a normal temperature. Then, the resulting water is retained in the water tub 22 and thus pumped to the cooling portion 30 by the pumping force of the pump 23. Next, it flows to the cooling water moving passage 411. Then, the above procedure of the circulation in the cooling water moving passage 411 is repeatedly taken, thereby carrying out a continuous cooling function.

On the other hand, if a degree of cooling in the cooling portion is to be adjusted, the interval between the first and second cooling plates 41 and 41' inserted into the receiving space 32 may be reduced or extended to thus adjust the gap between the inner side of the receiving space 32 and the outer side of each of the first and second cooling plates 41 and 41'.

As described above, there is provided a cooling device of a linear power amplifier in a mobile communication system capable of continuously and repeatedly circulating a cooling water heat-exchanged at a low temperature in a base on which the linear power amplifier is mounted, thus to enable the heat transmitted to the whole liner power amplifier from a radio frequency transistor to be cooled by using the cooling water having a substantially higher coefficient of heat transfer than that of air, whereby the life of the product can be extended and the reliability of the product can be improved by the reduction of vibration and noise.

What is claimed is:

1. A cooling device of a linear power amplifier in a mobile communication system, comprising:

a base on which said linear power amplifier is mounted;

a cooling water generating portion for generating a cooling water of a low temperature within an outer body of a base station transceiver subsystem; and a cooling portion for flowing the cooling water of the low temperature generated in said cooling water generating portion to the interior of the base, absorbing a surrounding heat to the cooling water of the low temperature, and then discharging the resulting water to said cooling water generating portion;

said cooling portion comprises:

a receiving space having horizontal upper and bottom surfaces and vertical both sides in the interior of said base of a right-angled hexahedron having a predetermined thickness and being opened forward and backward; and a cooling unit inserted and drawn into/from said receiving space and for passing the cooling water of the low temperature pumped in said cooling water generation portion;

said cooling unit comprising:

a pair of first and second cooling plates each having a cooling water moving passage in the interior thereof, a semicircular guide groove in a longitudinal direction on the up and down horizontal positions of the inner sides thereof, a plurality of spring support grooves into which springs having the same number as said plurality of spring support grooves are mounted at predetermined intervals on the inner sides relative to said guide groove, and upper and lower locking protrusions cut to form upper and lower inclined surfaces inclined by a predetermined angle from the outside to the inside on the edges of the outer sides corresponding to the center of said guide groove;

two sets of clips each extending to the both sides thereof at the same angle as in the inclined surface of each of said locking protrusions and having a guide hole on the center of the front surface thereof, such that they are inserted into the respective locking protrusions formed on the front and rear ends of said pair of first and second cooling plates in the state where the inner sides of said pair of first and second cooling plates correspond to each other; and upper and lower wrench bolts forming a wrench groove on the front ends thereof and a helix on the back ends thereof, such that they pass through the respective guide groove on the inner sides of said pair and second cooling plates via the front clips and are screw-coupled to the rear clips.

2. A cooling device of claim 1, wherein said cooling unit is assembled by inserting the one side of each of the springs into each of said spring support grooves formed on the inner surface of said first cooling plate, fully inserting the other side of each of the springs into each of said spring support grooves formed on the inner surface of said second cooling plate in the state where the inner surface of said first cooling plate is opposite to the inner surface of said cooling plate, fitting the front clip on which said guide hole as a hole is formed to each of the upper and lower locking protrusions formed on the front portions of said first and second cooling plates assembled to be opposite to each other, fitting the rear clip on which said guide hole as a nut hole is formed to each of the upper and lower locking protrusion formed on the rear portion thereof, and passing each of said upper and lower wrench bolts through said guide hole of the front clip and then screw-coupling to said guide hole of the rear clip.

3. A cooling device of claim 1, wherein said cooling water moving passage is of a "U" shape with an inlet and an outlet on the one side thereof.

4. A cooling device of claim 1, wherein said cooling water moving passage is provided with a plurality of cooling fins spaced at predetermined intervals in the interior thereof.

* * * * *